United States Patent
Rau et al.

(10) Patent No.: US 8,570,744 B2
(45) Date of Patent: Oct. 29, 2013

(54) COLD PLATE HAVING BLADES THAT INTERLEAVE WITH MEMORY MODULES

(75) Inventors: Timothy Rau, Sacramento, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 37 days.

(21) Appl. No.: 13/379,393

(22) PCT Filed: Oct. 30, 2009

(86) PCT No.: PCT/US2009/062722
§ 371 (c)(1),
(2), (4) Date: Dec. 20, 2011

(87) PCT Pub. No.: WO2011/053307
PCT Pub. Date: May 5, 2011

(65) Prior Publication Data
US 2012/0113586 A1      May 10, 2012

(51) Int. Cl.
*H05K 7/20* (2006.01)
*G06F 1/20* (2006.01)

(52) U.S. Cl.
USPC .............. 361/702; 361/679.52; 361/679.54; 361/699; 361/704; 361/716; 361/720; 361/721

(58) Field of Classification Search
USPC ............. 361/67.46–679.47, 679.52, 679.54, 361/688–689, 699, 702, 704, 716, 361/719–721; 165/104.33, 185
See application file for complete search history.

(56) References Cited

U.S. PATENT DOCUMENTS

| | | | |
|---|---|---|---|
| 6,665,184 B2 * | 12/2003 | Akselband | 361/699 |
| 6,853,554 B2 * | 2/2005 | Bash et al. | 361/699 |
| 7,023,701 B2 * | 4/2006 | Stocken et al. | 361/704 |
| 7,151,668 B1 * | 12/2006 | Stathakis | 361/700 |
| 7,286,355 B2 * | 10/2007 | Cheon | 361/699 |
| 7,289,331 B2 * | 10/2007 | Foster et al. | 361/719 |
| 7,339,793 B2 * | 3/2008 | Foster et al. | 361/721 |
| 7,342,797 B2 * | 3/2008 | Kamath et al. | 361/721 |
| 7,539,020 B2 * | 5/2009 | Chow et al. | 361/726 |
| 7,599,184 B2 * | 10/2009 | Upadhya et al. | 361/699 |
| 7,907,398 B2 * | 3/2011 | Hrehor et al. | 361/679.53 |
| 7,933,125 B2 * | 4/2011 | Wei et al. | 361/699 |
| 7,965,509 B2 * | 6/2011 | Campbell et al. | 361/699 |
| 7,969,736 B1 * | 6/2011 | Iyengar et al. | 361/699 |
| 8,004,841 B2 * | 8/2011 | Cipolla et al. | 361/699 |
| 8,081,473 B2 * | 12/2011 | Cipolla et al. | 361/719 |
| 8,289,710 B2 * | 10/2012 | Spearing et al. | 361/701 |
| 8,385,069 B2 * | 2/2013 | Iyengar et al. | 361/700 |
| 8,493,738 B2 * | 7/2013 | Chainer et al. | 361/700 |
| 2006/0250772 A1 * | 11/2006 | Salmonson et al. | 361/698 |
| 2008/0084668 A1 | 4/2008 | Campbell et al. | |
| 2008/0264613 A1 | 10/2008 | Chu | |
| 2009/0002951 A1 * | 1/2009 | Legen et al. | 361/715 |
| 2010/0085712 A1 | 4/2010 | Hrehor, Jr. et al. | |
| 2010/0091447 A1 * | 4/2010 | Jaggers et al. | 361/679.47 |
| 2012/0020004 A1 * | 1/2012 | Rau et al. | 361/679.31 |
| 2012/0026670 A1 * | 2/2012 | Rau et al. | 361/679.31 |
| 2012/0279686 A1 * | 11/2012 | Chainer et al. | 165/104.21 |
| 2013/0120926 A1 * | 5/2013 | Barina et al. | 361/679.32 |

FOREIGN PATENT DOCUMENTS

| | | | | |
|---|---|---|---|---|
| WO | WO 2011053313 A1 * | 5/2011 | | G06F 1/20 |
| WO | WO 2013078828 A1 * | 6/2013 | | G06F 1/20 |

* cited by examiner

*Primary Examiner* — Robert J Hoffberg

(57) ABSTRACT

A cold plate has blades arranged to be interleaved with memory modules or memory module sockets. A liquid cooling loop is thermally coupled to the blades of the cold plate.

17 Claims, 9 Drawing Sheets

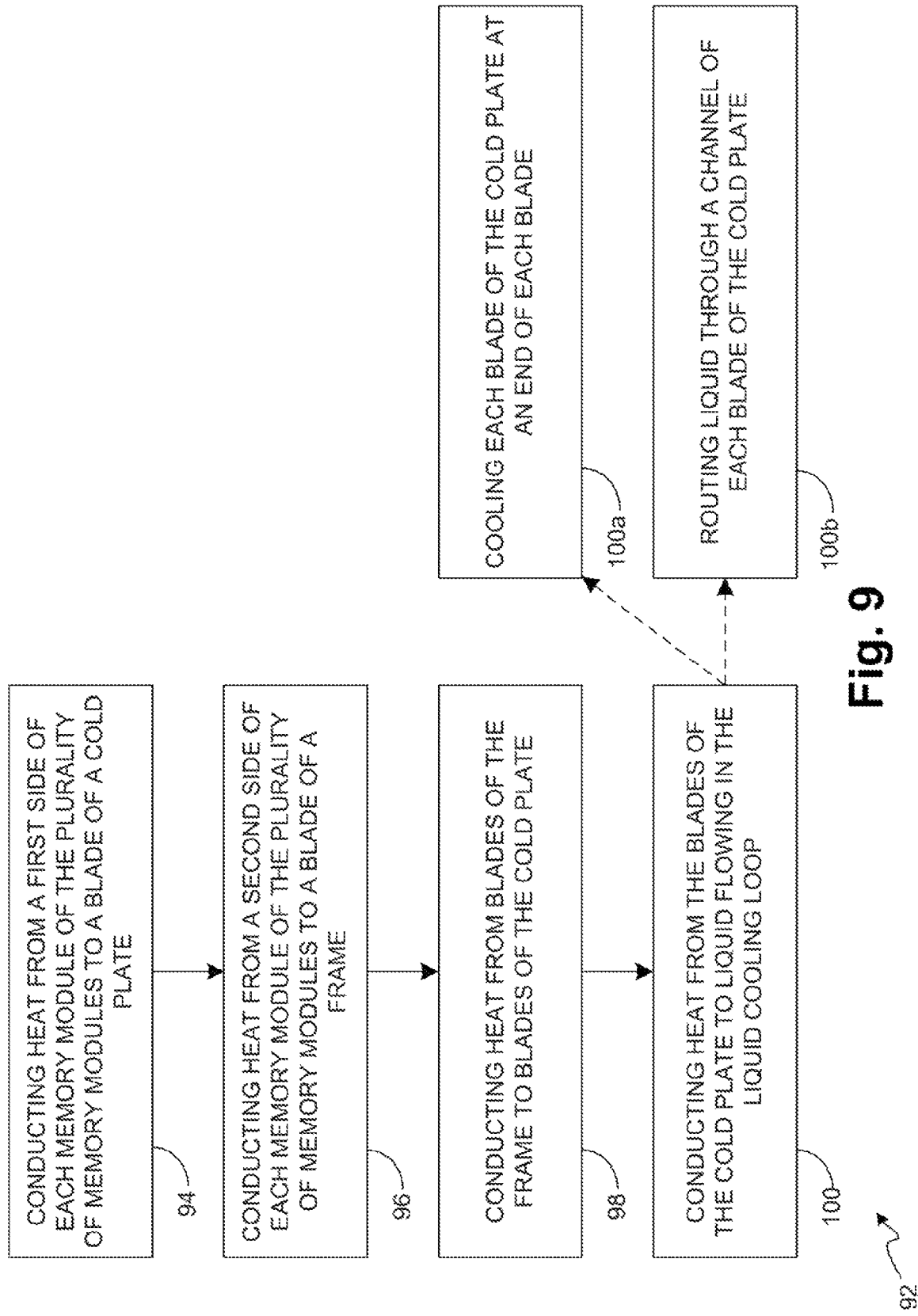

COLD PLATE HAVING BLADES THAT INTERLEAVE WITH MEMORY MODULES

CROSS-REFERENCES TO RELATED APPLICATIONS

The present patent application is related to the following patent applications: COOLING MEMORY MODULES USING COLD PLATE BLADES COUPLED TO THE MEMORY MODULES VIA CLIPS by Timothy Rau and Glenn C. Simon, and assigned US Patent Application Publication 2012/0026670, A FRAME HAVING FRAME BLADES THAT PARTICIPATE IN COOLING MEMORY by Timothy Rau and Glenn C. Simon, and assigned US Patent Application Publication 2012/0020004, and COOLING MEMORY-MODULES USING WEDGE-SHAPED HEAT SPREADERS IN THERMAL CONTACT WITH COLD PLATE BLADES AND MEMORY MODULES by Timothy Rau, Glenn C. Simon, and Bryan Bolich, and assigned World Intellectual Property Organization Publication 2011/053313. All related applications, and the present application, were filed on Oct. 30, 2009.

BACKGROUND

In the art of computing, individual memory integrated circuits (ICs) are often provided on a dual in-line memory module (DIMM). Often a heat spreader is attached over the memory ICs to dissipate the heat generated by the memory ICs across the length of the DIMM. However, it is often desirable to provide additional cooling.

Typically, DIMM sockets are positioned on a motherboard in close proximity to each other, thereby simplifying routing of memory signal traces on the motherboard and minimizing space used by memory. A typical separation between adjacent DIMMs is 10 millimeters.

Two methods known in the art for providing additional cooling are air cooling and liquid cooling. Because of the close spacing of adjacent DIMMs, both methods often use space above the DIMM. Typically, air cooling uses a solid heat conducting metal or vapor chambers and associated tubing to conduct heat from the heat spreader to a heatsink above the DIMM.

Typically, liquid cooling uses a suitable liquid, such as propylene glycol or ethylene glycol, mixed with water, to conduct heat from the heat spreader to the liquid. The heat is removed as the liquid is pumped through a channel associated with each DIMM. The liquid is then pumped to a heat exchanger, where heat is removed from the liquid. Typically, tubing is coupled to each DIMM along the top of the top of the DIMM.

BRIEF DESCRIPTION OF THE DRAWINGS

The Figures depict embodiments, implementations, and configurations of the invention, and not the invention itself.

FIG. 9 is a flowchart illustrating how embodiments of the present invention cool memory modules.

DETAILED DESCRIPTION

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

As discussed in the Background section above, commercially available dual in-line memory module (DIMM) cooling solutions use space above the DIMMs to facilitate cooling. For air cooling, heatsinks are positioned above the DIMMs. Furthermore, cooling fans and air channels are often needed to move air over the heatsinks.

Commercially available liquid cooling solutions have a liquid inlet and outlet for each DIMM. The inlets and outlets, along with the associated tubing, consume space above the DIMMs. Furthermore, the need to connect tubing to the inlet and outlet of each DIMM makes assembly and servicing cumbersome.

In accordance with embodiments of the present invention, a cold plate having a liquid inlet and outlet is provided for each block of DIMMs. DIMM sockets are attached to a motherboard, and may have a standard spacing of 10 millimeters between adjacent DIMM sockets. The cold plate includes a series of wedge-shaped blades that are positioned proximate the DIMM sockets such that a surface of a wedge-shaped blade is positioned adjacent to a DIMM heat spreader when a DIMM is installed. Note that in other configurations, it is possible to use DIMMs without heat spreaders, with the surface of a blade in direct contact with the individual memory integrated circuits (ICs) on the DIMM.

A frame having blades is positioned, over each block of DIMMs. In one embodiment, the frame is attached to the cold plate via a hinge, and pivots into an installed and closed position. In another embodiment, the frame is separate from the cold plate, and is installed into a final position by latching the frame to the cold plate at two ends of the frame.

The blades of the frame are attached to the frame using spring-loaded mechanisms that allow the blades to have a certain amount of movement within the frame. Each blade of the frame has a first surface adapted to contact a heat spreader of a DIMM, and a second surface adapted to contact a wedge-shaped blade of the cold plate.

When assembled, a cold plate/frame configuration positioned around a bank of DIMMs, in accordance with embodiments of the present invention, uses little additional space compared to a standard bank of DIMMs of the prior art. Installation and servicing are simplified, since after the frame is removed or pivoted to an open position, DIM Ms can be added or removed, as in the prior art.

Figure 1:
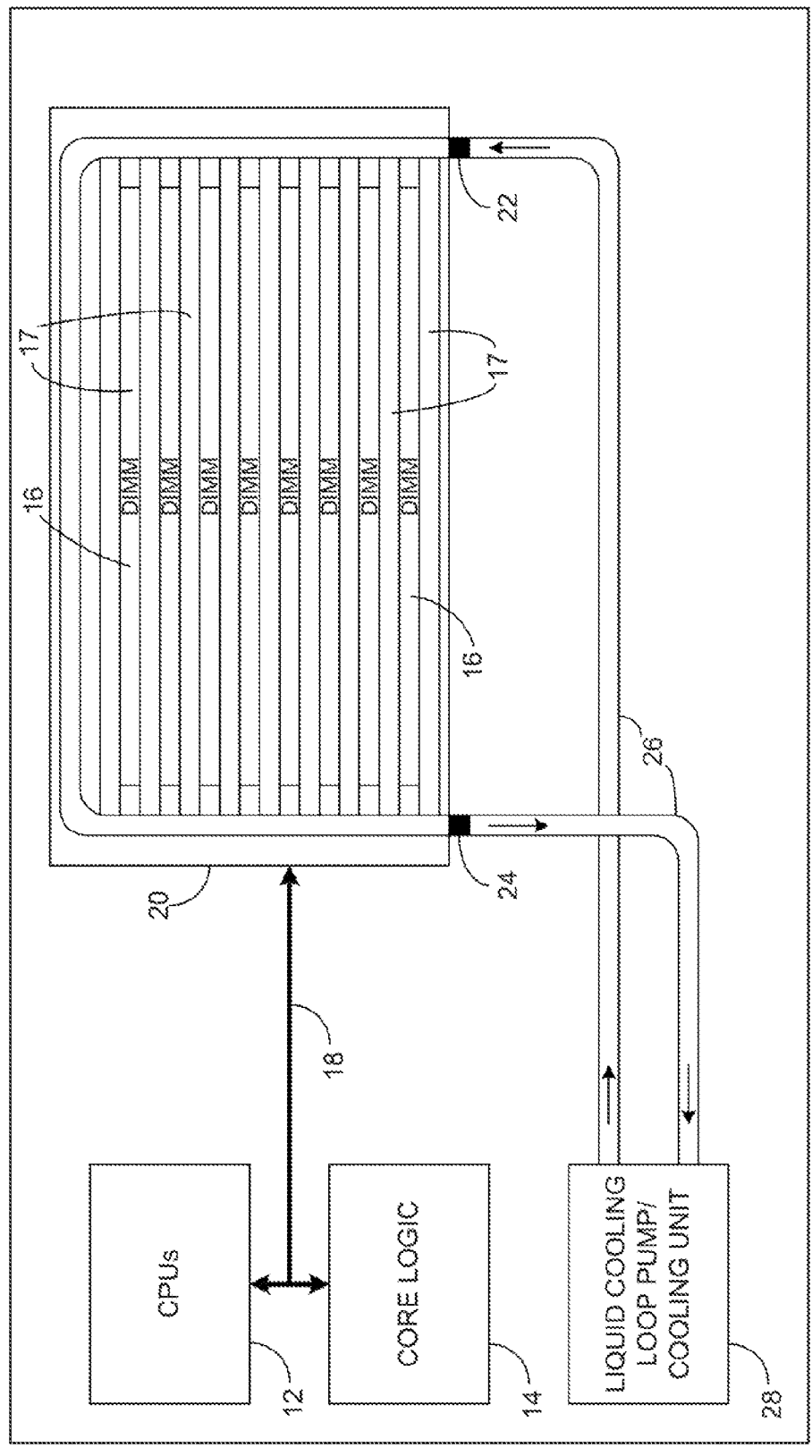
FIG. 1 is a functional block diagram of computer, having a cooling loop for cooling memory, in accordance with embodiments of the present invention.

FIG. 1 is a functional block diagram of computer 10, in accordance with embodiments of the present invention. Details of the cold plate and frame structures, in accordance with embodiments of the present invention, will be shown in other figures.

Computer system 10 includes one or more central processing units (CPUs) 12, core logic 14, DIMMs 16, bus 18, cold plate and frame 20 (which includes blades 17, liquid inlet 22, and liquid outlet 24), tubing 26, and liquid cooling loop pump/cooling unit 28.

CPUs 12 represents CPUs known in the art, such as several CPUs in discrete packages and multi-core CPUs in a single package. Core logic 14 represents core logic known in the art, such as a south bridge, a north bridge, memory controllers, I/O controllers, and the like. As the art of computers continues to advance, some of these functions, such as the memory controllers, are provided in the CPU package. Bus 18 represents one or more buses known in the art for connecting CPUs 12, core logic 14, and DIMMs 16.

Liquid cooling loop pump/cooling unit 28 pumps and cools liquid coolant using techniques known in the art. Any suitable coolant liquid, such as propylene glycol or ethylene glycol, mixed with water, can be used. The liquid may be cooled using a simple heat exchanger and fan, or by more advanced techniques, such as Peltier coolers or heat pumps. Also note that the function provided by unit 28 may be implemented at a variety of levels, such as in the computer system, within a rack, within a row of racks, or within a data center. It is also possible to integrate the liquid cooling function with a data center air conditioning system.

Note that it may also be desirable to cool CPUs 12 using a liquid cooling loop. In such a configuration, the loop can also flow through the CPUs, or a separate loop may be provided. For simplicity, the liquid cooling loop is only shown as cooling DIMMs 16. The liquid flows through tubing 26 in the direction show by the arrows in the tubing. The cold plate of cold plate and frame 20 includes an inlet 22 and an outlet 24, both of which are coupled to tubing 26.

The liquid cooling loop is in thermal contact with blades 17. In FIG. 1, blades 17 are shown generically in block diagram form, and include blades associated with the frame of cold plate and frame 20, and blades associated with the cold plate of cold plate and frame 20, as will be shown in other figures and discussed in greater detail below. Blades 17 are interleaved with DIMMs 16, and cool DIMMs 16.

Figure 2:
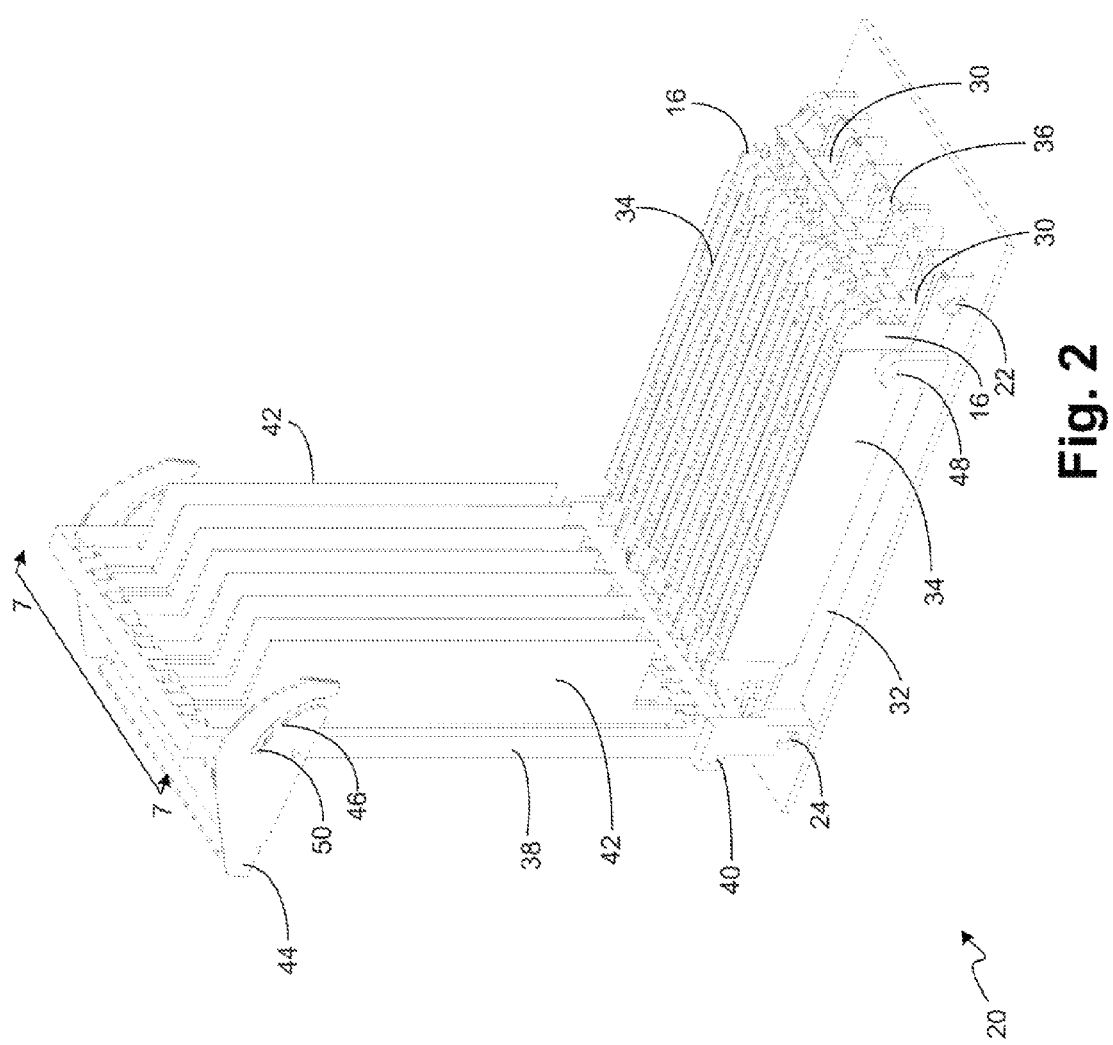
FIG. 2 shows an embodiment of a cold plate and frame in an open position, in accordance with embodiments of the present invention.

FIG. 2 shows an embodiment of cold plate and frame 20 of FIG. 1 in an open position, in accordance with embodiments of the present invention. In the open position, DIMMs may be inserted or removed. Cold plate and frame 20 includes liquid inlet 22 and liquid outlet 24. DIMMs 16 are inserted in DIMM sockets 30. The configuration shown in FIG. 2 supports eight DIMMs. However, those skilled in the art will recognize that additional or fewer DIMMs may be supported by embodiments on the present invention.

Cold plate 32 of cold plate and frame 20 includes fixed wedge-shaped blades 34, which are thermally coupled to liquid cooling loop 36. In a configuration supporting eight DIMMs as shown in FIG. 2, nine blades 34 are provided so that each surface of a DIMM is adjacent to a surface of a blade 34. In this embodiment, frame 38 of frame and cold plate 20 is coupled to cold plate 32 via a hinge 40.

Frame 38 includes wedge-shaped blades 42, which have a certain degree of movement provided by a spring-load mechanism, which will be discussed in greater detail below. In a configuration supporting eight DIMMs as shown in FIG. 2, eight blades 42 are provided on frame 38. Frame 38 includes handle 44, which is used to raise and lower frame 38, and lock frame 38 in place. Handle 44 includes a locking mechanism comprising slot 46 that cooperates with detent 50 and a locking feature of cold plate 32 comprising pin 48 to lock handle 44 (and frame 38) into a closed position with cold plate 32, as will be shown in FIG. 3.

Figure 3:
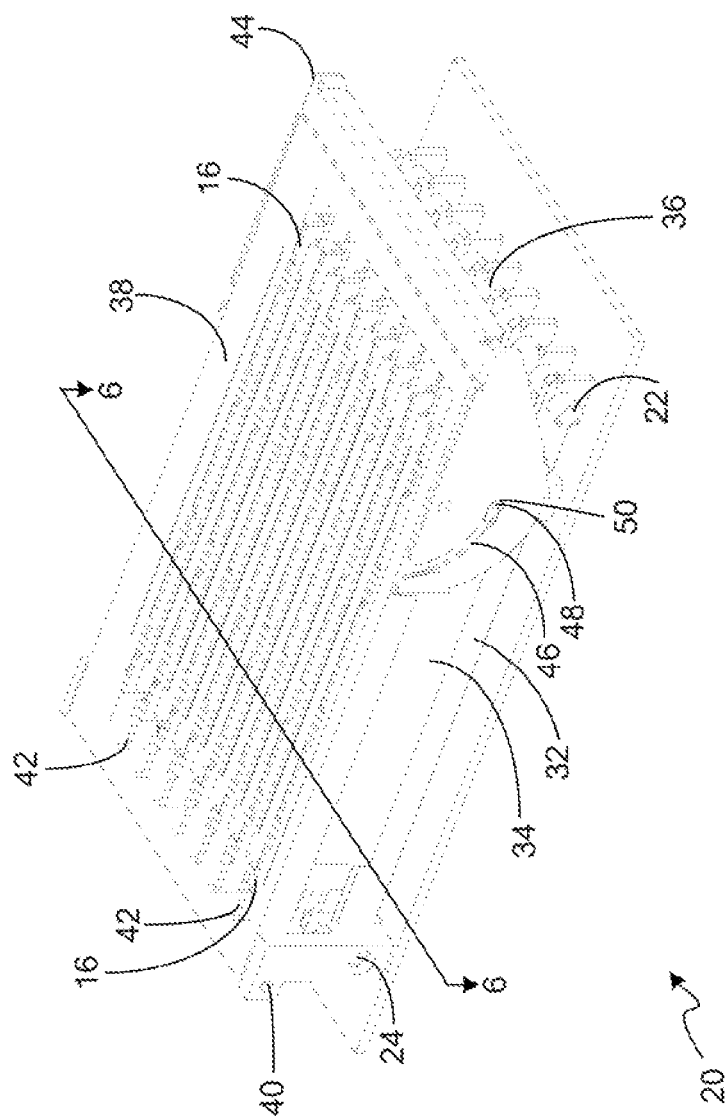
FIG. 3 shows the plate and frame of FIG. 2 in a closed position, in accordance with embodiments of the present invention.

FIG. 3 shows the plate and frame 20 of FIG. 2 in a closed position. In the closed position, handle 44 is pressed down, and pin 50 locks and retains handle 44 in the closed position via pin 48 engaging detent 50 of slot 46. In the closed position, blades 42 of frame 38 are interposed between the DIMMs 16 and blades 34 of cold plate 32 to cool DIMMs 16 during operation.

Figure 4:
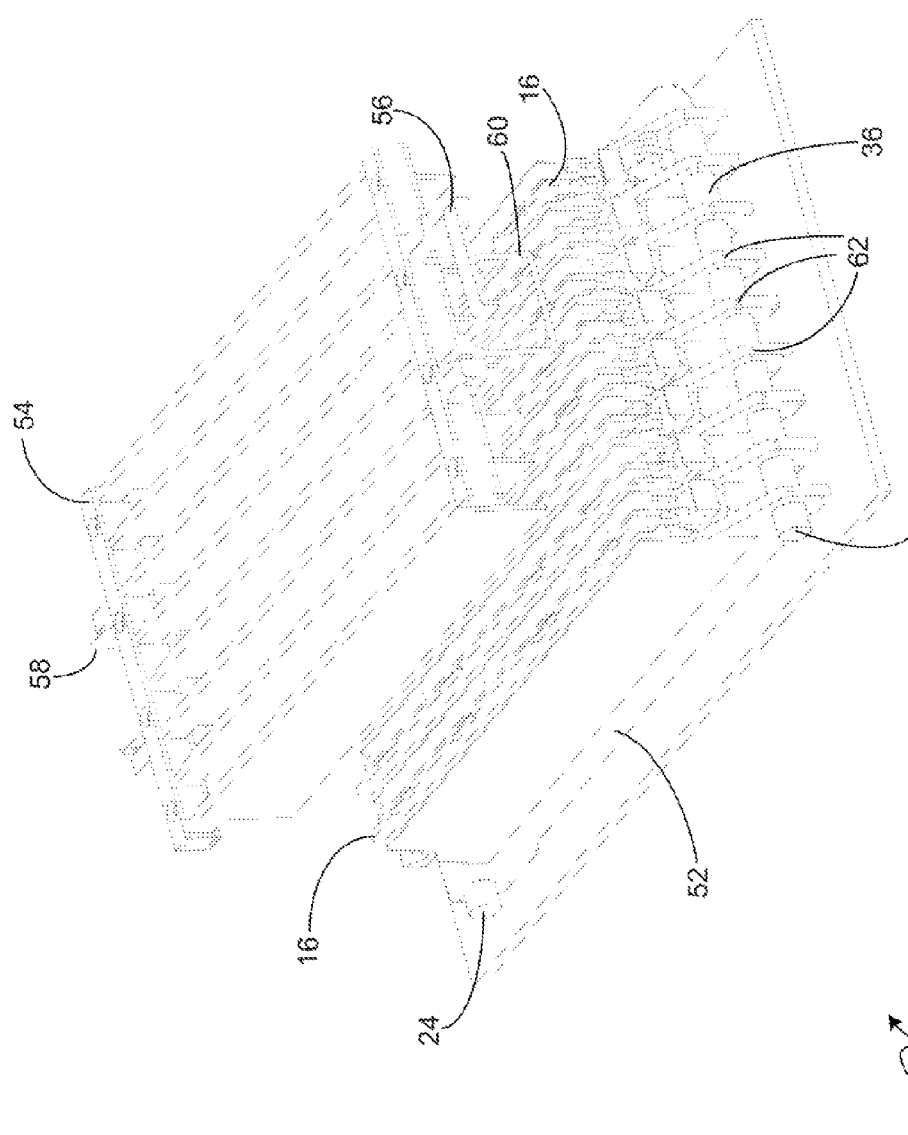
FIG. 4 shows another embodiment of a cold plate and frame in a detached state, in accordance with embodiments of the present invention.

FIG. 4 shows another embodiment of cold plate and frame 20 of FIG. 1 in a detached position, in accordance with embodiments of the present invention. In this embodiment, cold plate and frame 20 includes cold plate 52 and frame 54. The embodiment shown in FIG. 4 is similar to the embodiment shown in FIG. 3, except that the frame is detachable from the cold plate and is not coupled to the cold plate via a hinge. Accordingly, frame 54 includes handles 56 and 58, which lock frame 54 to cold plate 52. Handle 56 includes locking mechanism comprising hook member 60, which engages a locking feature comprising slots 62. Handle 58 includes a similar hook member that engages a similar set of slots. However, the hook member and slots associated with handle 58 are not shown in FIG. 4.

Figure 5:
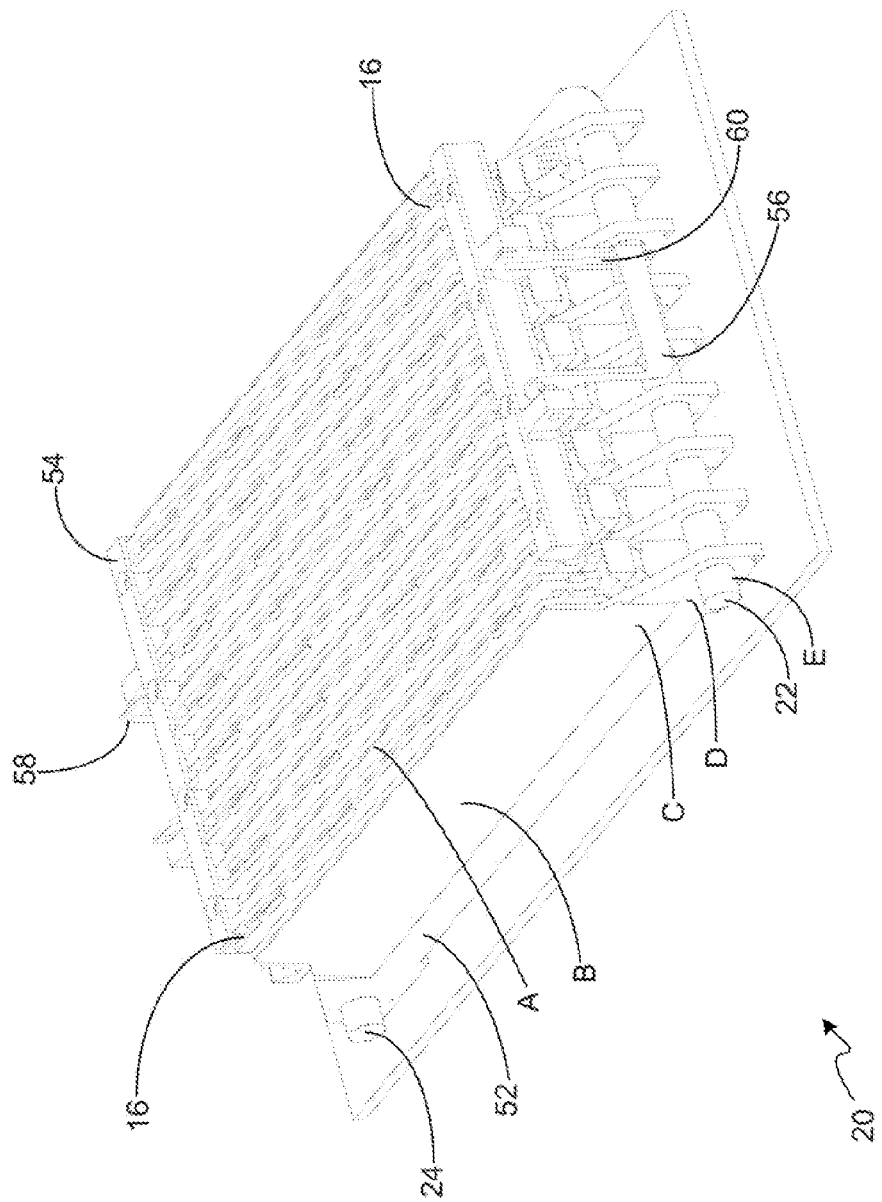
FIG. 5 shows the cold plate and frame of FIG. 4 after the frame has been coupled to the cold plate, in accordance with embodiments of the present invention.

FIG. 5 shows the cold plate and frame 20 of FIG. 4 after frame 54 has been coupled to cold plate 52. In FIG. 5, the labels A-E will be discussed below with reference to Table 1. In this configuration, handles 56 and 58 have been moved downward, with hook member 60 of handle 56 engaging slots 62 (shown in FIG. 4), and the hook member and slots associated with handle 58 being similarly engaged.

Figure 6:
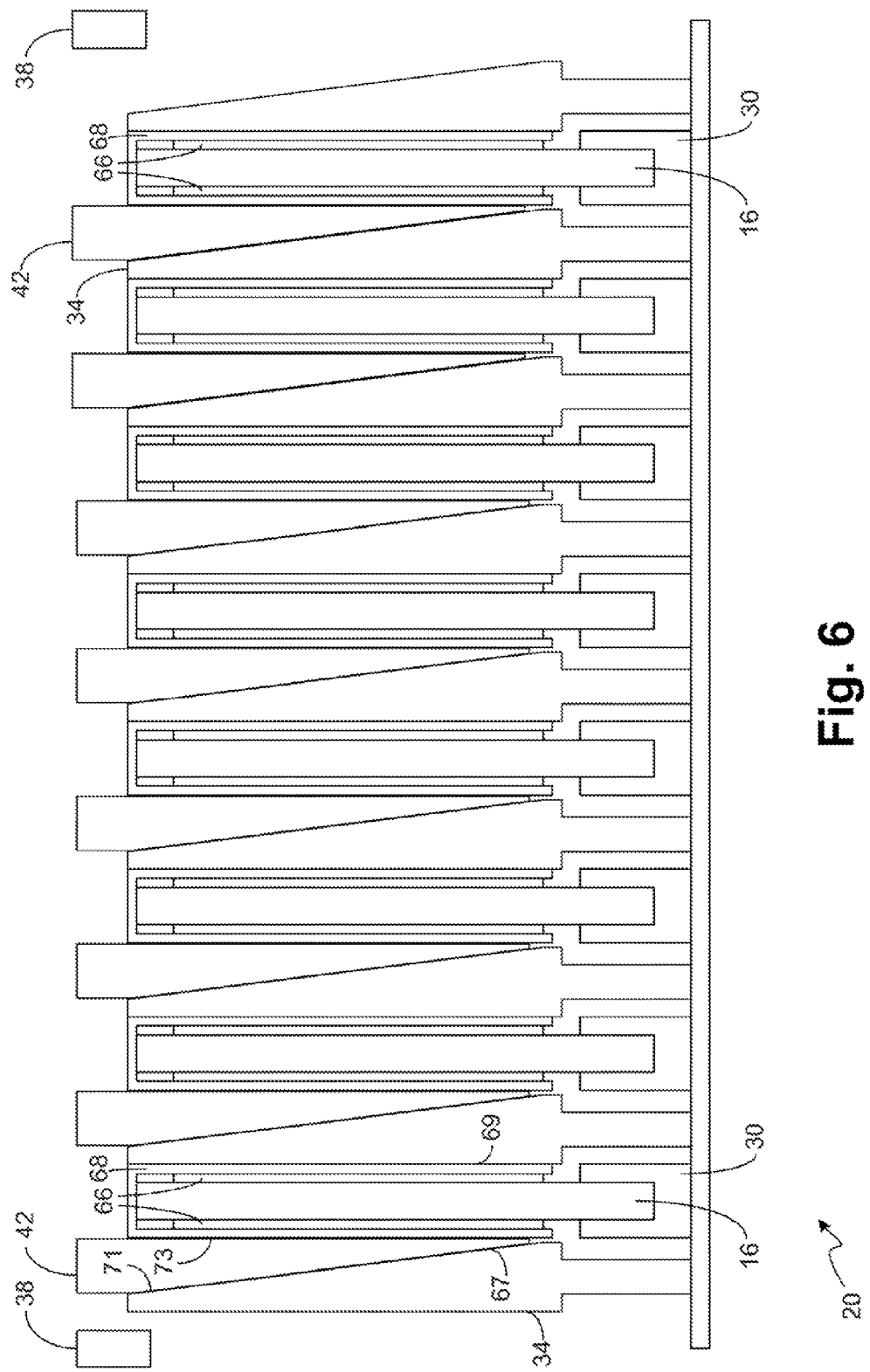
FIG. 6 is a sectional view taken along line 6-6 of FIG. 3 showing the orientations of DIMMs, blades of the cold plate, and blades of the frame when the frame is closed and a handle of the frame has been pressed down to lock the frame to the cold plate.

FIG. 6 is a sectional view taken along line 6-6 of FIG. 3 showing the orientations of the DIMMs 16, blades 34 of cold plate 32, and blades 42 of frame 38 when frame 38 is closed and handle 44 has been pressed down to lock frame 38 to cold plate 32. A corresponding sectional view taken from the embodiment shown in FIG. 5 would be substantially similar.

In FIG. 6, dual sided DIMMs with heat spreaders are shown. Accordingly, each DIMM 16 is inserted in a DIMM socket 30, and includes memory ICs 66 on both sides of the DIMM, and a heat spreader 68. Those skilled in the art will recognize that single-sided DIMMs may also be used with embodiments of the present invention, and DIMMs without heat spreaders may be used.

Note that before frame 38 is lowered into place, each DIMM 16 has one surface adjacent to a sloped surface of a blade 34 (such as surface 67), and another surface adjacent to a surface of a blade 34 that is not sloped (such as surface 69). As frame 38 is lowered into place, the sloped surfaces of blades 42 (such as surface 71) contact the sloped surfaces of blades 34, and the surfaces of blades 42 that are not sloped (such as surface 73) contact a DIMM. In the closed position shown in FIGS. 6 and 3, one surface of each DIMM 16 is cooled by a thermal conduction path formed by contact with a non-sloped surface of a blade 34 of cold plate 32, and the other surface of each DIMM 16 is cooled by a thermal conduction path formed by contact with a non-sloped surface of a blade 42 of frame 38, through the sloped surface of blade 42, to the sloped surface of a blade 34.

The cooperating sloped edges of the blades 34 and 42 provide lateral force to the DIMMs 16 to enhance thermal coupling. A spring-loaded mechanism, which will be discussed in greater detail with reference to FIG. 7 below, maintains the lateral force, while compensating for variations caused by thermal expansion and contraction, and variations caused by manufacturing and assembly tolerances.

Figure 7:
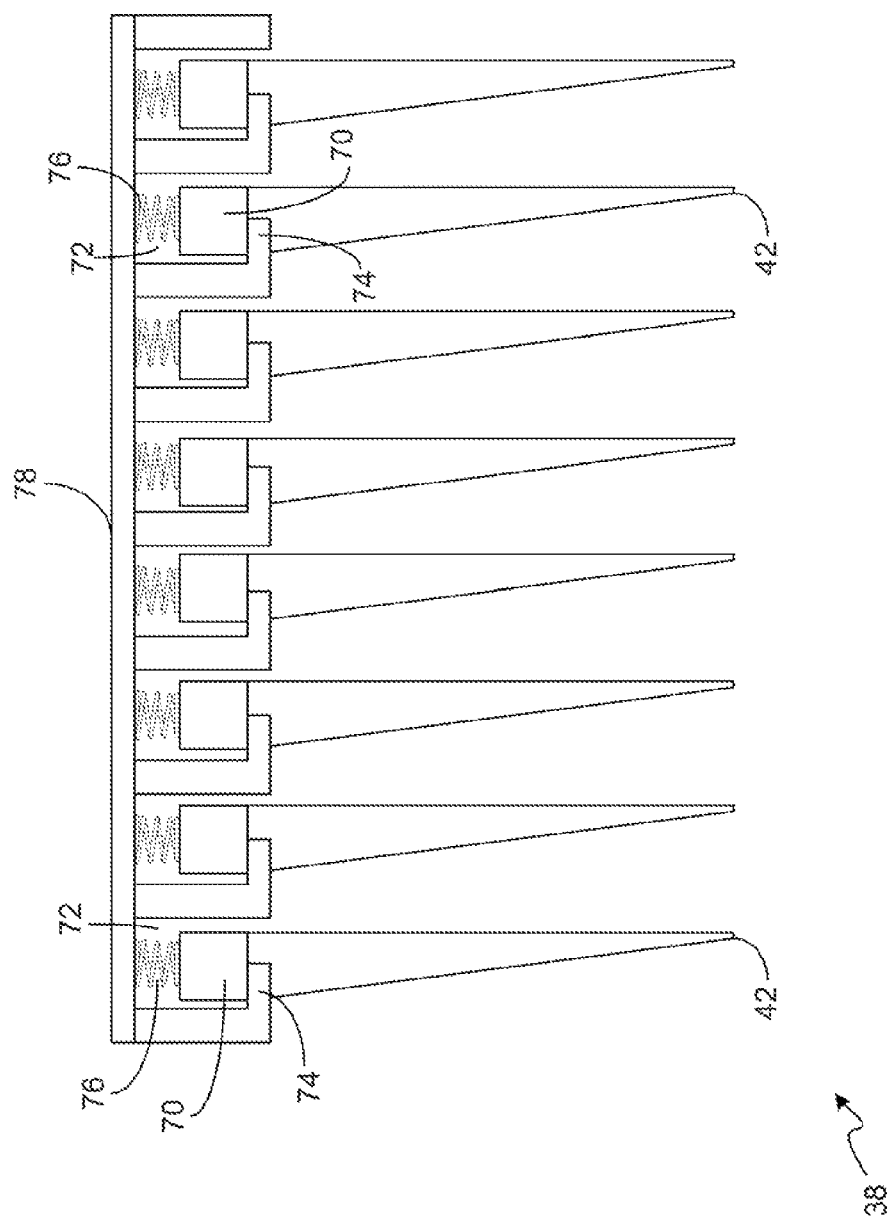
FIG. 7 is a sectional view of the frame of FIG. 2 taken along line 7-7 showing spring-loaded mechanisms that support the blades in the frame, in accordance with embodiments of the present invention.

FIG. 7 is a sectional view of frame 38 taken along line 7-7 of FIG. 2 showing the spring-loaded mechanisms that support blades 42 in frame 38. Each blade includes a mounting member 70 that extends beyond the surfaces that contact the DIMMs 16 and blades 34 of cold plate 32. Frame 38 includes a mounting cavity 72 for each mounting member 70 of each blade 42. Along the base of mounting cavities 72 are retention surfaces 74. Retention surfaces 74 retain mounting members 70 in mounting cavities 72 during assembly and when frame 38 is in the open position. Springs 76 are positioned within mounting cavities 72 and in contact with mounting members 70. A cap bar 78 is attached above the springs, thereby compressing the springs.

When frame 38 is in the closed position, blades 42 are in contact with DIMMs 16 and blades 34 of cold plate 32, as shown in FIG. 6. Accordingly, springs 76 are compressed further, and a gap is present between mounting members 70 and retention surfaces 74. Since springs 76 are compressed, the springs continue to exert downward force, thereby maintaining the thermal conduction paths between DIMMs 16 and blades 34 and 42, as shown in FIG. 6.

Note that when frame 38 is in the closed position, gaps will typically exist between mounting members 70, and the inner walls of cavities 72, retention members 74, and cap bar 78. In essence, the mounting members are "floating" within mounting cavities 72, with downward pressure being exerted by the springs 76. Accordingly, each blade 42 can accommodate variations caused by thermal expansion and contraction, and variations caused by manufacturing and assembly tolerances.

In the embodiments shown in FIGS. 1-5, the cold plate includes a single cooling loop that traverses a portion of the perimeter of the block of DIMMs 16. Each blade of the cold plate has two ends coupled to the cooling loop, and the blades of both the cold plate and frame are made of a material having excellent thermal transfer properties, such as copper, aluminum, steel, and the like.

Table 1 below shows temperature measurements taken at points A, B, C, D, and E of FIG. 5 at two different liquid flow rates, with DIMMs 16 operating under a typical load. Point A represents the center of a blade of the frame, point B represents the center of a blade of the cold plate, point C represents an end of the active cooling surface of the blade of the cold plate, point D represents an end of the blade of the cold plate proximate the attachment point to the cooling loop, and point E represents a point on the cooling loop. Note that temperature measurements at flow rates of 0.3 and 1.1 liters per minutes are shown.

In a typical server computer system, it is desirable to maintain case temperatures at or below 85° C. As can be seen in Table 1, the embodiments shown in FIGS. 1-5 maintain temperatures below 85° C. at flow rates of 0.3 and 1.1 liters per minutes.

TABLE 1

| | | Temperature gradient | |
|---|---|---|---|
| | Location | Temperature (deg C.) | Delta T (deg C.) |
| Low liquid flow rate (0.3 liters/min) | A | 81 | |
| | | | 13 |
| | B | 68 | |
| | | | 1 |
| | C | 67 | |
| | | | 11 |
| | D | 56 | |
| | | | 24 |
| | E | 32 | |
| High liquid flow rate (1.1 liters/min) | A | 72 | |
| | | | 12 |
| | B | 60 | |
| | | | 4 |
| | C | 56 | |
| | | | 11 |
| | D | 45 | |
| | | | 17 |
| | E | 28 | |

Figure 8:
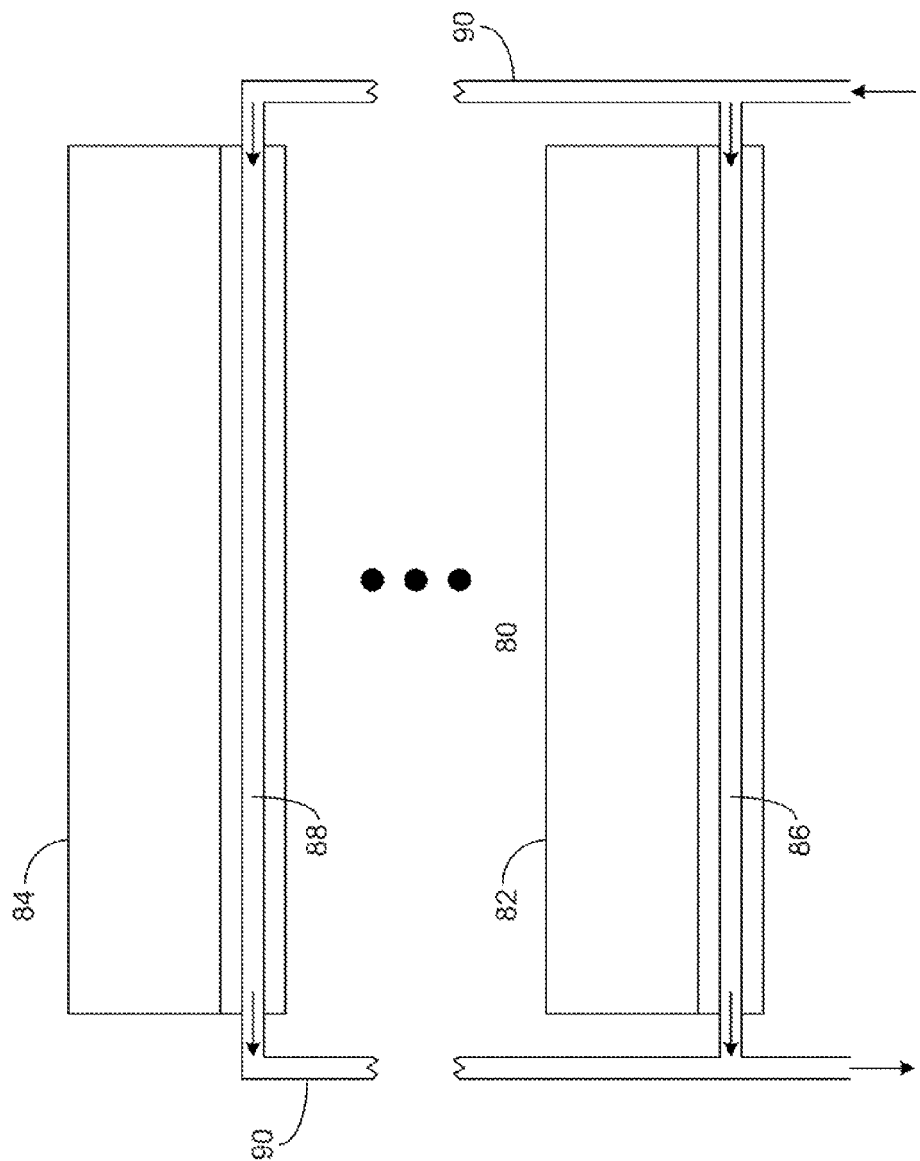
FIG. 8 is a block diagram of a cold plate wherein cooling liquid is routed through each blade, in accordance with embodiments of the present invention.

While the embodiments shown in FIGS. 1-5 having a cooling loop that traverses a portion of the perimeter of the block of DIMMs provides acceptable performance, in another embodiment, liquid is routed through each blade of the cooling plate. FIG. 8 shows a block diagram of this embodiment.

In FIG. 8, blade 82 of cold plate 80 represents a first blade in a series of blades, and blade 84 represents a last blade in the series. Blade 82 includes channel 86, and blade 84 includes channel 88, with each channel carrying cooling liquid through the blade. Cooling loop 90 is configured to route cooling liquid through the channel of each blade. Accordingly, although the embodiment shown in FIG. 8 is more complex than the embodiments shown in FIGS. 1-5, the temperatures along the channels 86 and 88 will tend to be more similar to the temperatures at points D and E in Table 1.

FIG. 9 is a flowchart 92 illustrating how embodiments of the present invention cool DIMMs. In block 94, heat is conducted away from a first side of each DIMM to a blade of a cold plate. In block 96, heat is conducted away from a second side of each DIMM to a blade of a frame. In block 98, heat is conducted from the blades of the frame to the blades of the cold plate. Finally, in block 100 heat is conducted from the blades of the cold plate to the liquid flowing in the liquid cooling loop.

Block 100A, in conjunction with block 100, represents the embodiments shown in FIGS. 1-5. Accordingly, heat is conducted from the ends of the cold plate blades to the liquid cooling loop. Block 100B, in conjunction with block 100, represents the embodiment shown in FIG. 8. Accordingly, cooling liquid is routed through a channel of each blade of the cold plate.

Embodiments of the present invention provide many advantages over the prior art. Liquid cooling loop connections remain fixed as DIMMs are added or removed. In contrast, prior art configurations provide liquid inlets and outlets for each DIMM, thereby causing the addition and removal of DIMMs to be cumbersome and time consuming. With embodiments of the present invention, a single inlet and outlet is provided for a block of DIMMs, and the inlet/outlet connections need only be coupled once during the manufacturing process.

Embodiments of the present invention require little extra space above the DIMMs, as is shown in the Figures. Prior art air and liquid cooling solutions often consume space above the DIMMs. In addition, embodiments of the present invention have a system board "footprint" similar to prior art DIMM blocks. The only extra area required is the area reserved for the cooling loop along the sides of the DIMM block, and the area reserved for the inlets and outlets, and cooling loop connections. Also, space is saved by eliminating the need for cooling fans to direct airflow over the DIMMs. Of course, acoustic levels may also be reduced. Finally, embodiments of the present invention provide simple and tool-free memory configuration, since the frame is easily removed from the cold plate using one or more handles on the frame, thereby providing access to the DIMMs In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An apparatus for cooling memory modules comprising:
a cold plate comprising:
a liquid cooling loop having an inlet and an outlet; and
a plurality of cold plate blades thermally coupled to the cooling loop, the plurality of cold plate blades arranged to be interleaved with a plurality of memory modules; and
a frame comprising:
a plurality of frame blades arranged to be interposed between the plurality of memory modules and the plurality of cold plate blades when the frame is coupled to the cold plate,
wherein at least one first cold plate blade of the plurality of cold plate blades includes a sloped surface, and at least one second cold plate blade of the plurality of cold plate blades includes a surface that is not sloped, and at least one first frame blade of the plurality of frame blades includes a sloped surface, and at least one second frame blade of the plurality of frame blades includes a surface that is not sloped, and wherein a memory module of the plurality of memory modules has a first side cooled by the surface that is not sloped of the at least one second cold plate blade, and the memory module has a second side cooled by the surface that is not sloped of the at least one second frame blade.

2. The apparatus for cooling memory modules according to claim 1 wherein the frame includes a plurality of mounting cavities, and each frame blade of the plurality of frame blades includes a mounting member, with each mounting member positioned in a mounting cavity of the plurality of mounting cavities, and wherein a spring is included in each mounting cavity to urge the mounting member of each frame blade into thermal contact with the memory module of the plurality of memory modules and a cold plate blade of the plurality of cold plate blades.

3. The apparatus for cooling memory modules according to claim 1 wherein the sloped surface of the at least one first cold plate blade is in thermal contact with the sloped surface of the at least one first frame blade, and the sloped surfaces cooperate to apply lateral force to urge the surfaces that are not sloped into thermal contact with the first and second sides of the memory module.

4. The apparatus for cooling memory modules according to claim 1 wherein the liquid cooling loop traverses at least a portion of a perimeter of a block of the plurality of memory modules and is thermal contact with each cold plate blade proximate ends of each cold plate blades.

5. The apparatus for cooling memory modules according to claim 1 wherein each cold plate blade includes a channel, and the liquid cooling loop is coupled to each cold plate blade and cooling liquid is routed through the channel of each cold plate blade.

6. A computer system comprising:
at least one central processing unit;
a bank of memory module sockets having a plurality of memory module sockets;
a core logic;
at least one bus coupling the at least one central processing unit, the bank of memory module sockets, and the core logic;
a cold plate having a plurality of cold plate blades interleaved with the bank of memory module sockets, to cool a plurality of memory modules when the plurality of memory modules are inserted in the bank of memory module sockets;
a frame having a plurality of frame blades supported in the frame, the plurality of frame blades arranged to be interposed between the plurality of memory module sockets and the plurality of cold plate blades when the frame is coupled to the cold plate;
a liquid cooling loop having an inlet and an outlet, and in thermal contact with the plurality of cold plate blades; and
a liquid cooling loop pump and cooling unit coupled to the inlet and the outlet of the liquid cooling loop,
wherein the plurality of cold plate blades and the plurality of frame blades each have a sloped surface and a surface that is not sloped.

7. The computer system according to claim 6 wherein the frame coupled to the cold plate at a first end via a hinge comprising: a handle having a locking mechanism that engages a locking feature of the frame; and
wherein the frame pivots along the hinge between an open position and a closed position, and in the closed position, the plurality of frame blades are interposed between the plurality of cold plate blades.

8. The computer system according to claim 7 further comprising:
a plurality of memory modules inserted into the plurality of memory module sockets of the bank of memory module sockets;
wherein when the frame is in the closed position, each memory module of the plurality of memory modules has a first side cooled by thermal contact with a surface of a frame blade of the plurality of frame blades that is not sloped, and a second side that is cooled by thermal contact with a surface of a cold plate blade of the plurality of cold plate blades that is not sloped, with sloped surfaces of each of the plurality of frame blades in thermal contact with sloped surfaces of a corresponding one of the plurality of cold plate blades.

9. The computer system according to claim 7 wherein the frame includes a plurality of mounting cavities, and each frame blade of the plurality of frame blades includes a mounting member, with each mounting member positioned in a mounting cavity of the plurality of mounting cavities, and wherein a spring is included in each mounting cavity to urge each frame blade into thermal contact with a memory module of the plurality of memory modules and a corresponding cold plate blade of the plurality of cold plate blades.

10. The computer system according to claim 6 wherein the frame is a detachable frame attached to the cold plate, the frame comprising:
   first and second handles having a locking mechanisms that engage locking features of the frame;
   wherein the plurality of frame blades are interposed between the plurality of cold plate blades.

11. The computer system according to claim 10 further comprising:
   a plurality of memory modules inserted into the plurality of memory module sockets of the bank of memory sockets;
   wherein each memory module of the plurality of memory modules has a first side cooled by thermal contact with a surface of a frame blade of the plurality of frame blades that is not sloped, and a second side that is cooled by thermal contact with a surface of a cold plate blade of the plurality of cold plate blades that is not sloped, with sloped surfaces of each of the plurality of frame blades in thermal contact with sloped surfaces of a corresponding one of the plurality of cold plate blades.

12. The computer system according to claim 11 wherein the frame includes a plurality of mounting cavities, and each frame blade of the plurality of frame blades includes a mounting member, with each mounting member positioned in a mounting cavity of the plurality of mounting cavities, and wherein a spring is included in each mounting cavity to urge each frame blade of the plurality of blades into thermal contact with a memory module of the plurality of memory modules and a corresponding cold plate blade of the plurality of cold plate blades.

13. The computer system according to claim 6 the computer system further comprising:
   a plurality of memory modules inserted into the plurality of memory module sockets of the bank of memory sockets;
   wherein when the frame is coupled to the cold plate, each memory module of the plurality of memory modules has a first side cooled by thermal contact with a surface of a frame blade of the plurality of frame blades that is not sloped, and a second side that is cooled by thermal contact with a surface of a cold plate blade of the plurality of cold plate blades that is not sloped, with sloped surfaces of each of the plurality of frame blades in thermal contact with sloped surfaces of a corresponding one blades of the plurality of cold plate blades.

14. A method for removing heat from a plurality of memory modules cooled by a single liquid cooling loop coupled to interleaved cold plate blades of a cold plate comprising:
   conducting heat from a first side of each memory module of the plurality of memory modules to a cold plate blade of the cold blades, the cold plate blade includes a sloped surface and a surface that is not sloped, the first side cooled by the surface that is not sloped of the cold plate blade;
   conducting heat from a second side of each memory module of the plurality of memory modules to each frame blade of a frame, each frame blade includes a sloped surface and a surface that is not sloped, the second side cooled by the surface that is not sloped of the frame blade;
   conducting heat from the frame blades to the cold plate blades; and
   conducting heat from the cold plate blades to liquid flowing in the liquid cooling loop.

15. The method according to claim 14 wherein conducting heat from the cold plate blades to liquid flowing in the liquid cooling loop includes cooling each cold plate blade of the cold blades at an end of each cold plate blade.

16. The method according to claim 14 wherein conducting heat from the cold plate blades to liquid flowing in the liquid cooling loop includes routing liquid through a channel of each cold plate blade of the cold blades.

17. The method according to claim 14 further comprising forming thermal contact between the sloped surface of the cold plate blade and the sloped surface of the frame blade, the sloped surfaces cooperate to apply lateral force to urge the surfaces that are not sloped into thermal contact with the first and second sides of the memory module.

\* \* \* \* \*

UNITED STATES PATENT AND TRADEMARK OFFICE
CERTIFICATE OF CORRECTION

PATENT NO. : 8,570,744 B2  Page 1 of 1
APPLICATION NO. : 13/379393
DATED : October 29, 2013
INVENTOR(S) : Timothy Rau et al.

It is certified that error appears in the above-identified patent and that said Letters Patent is hereby corrected as shown below:

In the Claims:

In column 8, line 1, in Claim 4, delete "is" and insert -- in --, therefor.

Signed and Sealed this
Fourteenth Day of October, 2014

Michelle K. Lee
*Deputy Director of the United States Patent and Trademark Office*